United States Patent [19]
Tseng

[11] Patent Number: 5,795,806
[45] Date of Patent: Aug. 18, 1998

[54] METHOD TO INCREASE THE AREA OF A STACKED CAPACITOR STRUCTURE BY CREATING A GRATED TOP SURFACE BOTTOM ELECTRODE

[75] Inventor: Horng-Huei Tseng, Hsinchu, Taiwan

[73] Assignee: Vanguard International Semiconductor Corporation, Hsin-Chu, Taiwan

[21] Appl. No.: 835,576

[22] Filed: Apr. 9, 1997

[51] Int. Cl.$^6$ ................................. H01L 21/8242
[52] U.S. Cl. .............................. 438/255; 438/964
[58] Field of Search ........................ 438/253, 255, 438/396, 398, 665, 964

[56] References Cited

U.S. PATENT DOCUMENTS

| | | |
|---|---|---|
| 5,134,086 | 7/1992 | Ahn ........................... 438/964 |
| 5,254,503 | 10/1993 | Kenney ........................ 438/964 |
| 5,290,729 | 3/1994 | Hayashide et al. ............. 438/255 |
| 5,302,540 | 4/1994 | Ko et al. ..................... 438/255 |
| 5,492,848 | 2/1996 | Lur et al. .................... 438/396 |
| 5,521,408 | 5/1996 | Rha et al. .................... 257/309 |

*Primary Examiner*—Chandra Chaudhari
*Attorney, Agent, or Firm*—George O. Saile; Stephen B. Ackerman

[57] ABSTRACT

A method of creating an STC structure, used for high density, DRAM designs, has been developed. The process consists of creating a grated top surface topography for a polysilicon storage node electrode. The grated top surface topography is obtained by using a composite spot structure, of silicon oxide on small diameter, HSG polysilicon spots, as a mask for an anisotropic dry etch procedure, used to define lower features in an underlying polysilicon layer. The raised features of the grated top surface topography of the polysilicon storage node electrode, is comprised of the masking, small diameter, HSG polysilicon spots, on regions of the unetched polysilicon layer.

21 Claims, 4 Drawing Sheets

1

METHOD TO INCREASE THE AREA OF A STACKED CAPACITOR STRUCTURE BY CREATING A GRATED TOP SURFACE BOTTOM ELECTRODE

BACKGROUND OF THE INVENTION (1) Field of the Invention

The present invention relates to a method used to fabricate high density, semiconductor, DRAM cells, and more specifically to a process used to increase the surface area, and the accompanying capacitance of an STC component of the DRAM cell, via the use of a storage node electrode configuration, obtained via a novel semiconductor processing sequence.

(2) Description of the Prior Art

The semiconductor industry is continually striving to improve device performance, while still focusing on methods of reducing manufacturing costs. These objectives have been successfully addressed by the ability of the semiconductor industry to produce chips with sub-micron features, or micro-miniaturization. Sub-micron features allow the reduction in performance degrading capacitances and resistances to be realized. In addition the smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller, or sub-micron features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 16 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grained, (HSG), polysilicon layers. HSG polysilicon layers have been used as an overlying layer, on a conventional polysilicon structure, as shown by Hayashide, in U.S. Pat. No. 5,290,729. That invention describes a storage node, or lower electrode, of an STC structure, in which the surface area of the lower electrode is increased via growth of HSG polysilicon, on the top surface of the lower electrode. Another use of HSG polysilicon has been described by C. Y. Lu, in an invention disclosure, VIS85-111, (serial No. 08-734061, filed Oct. 18, 1996. That invention uses a discontinuous film, comprised of small diameter, HSG spots, as a mask to transfer the small diameter feature of the HSG spots to an underlying silicon oxide layer. The small diameter features, in the silicon oxide layer, are then used as a mask to allow patterning of an underlying polysilicon layer, exposed between the silicon oxide spots, to proceed, resulting in a top surface of polysilicon, exhibiting increased surface area.

This invention will describe a process for increasing the surface area of a polysilicon storage node electrode, by creating a top surface topography, comprised of a pattern of raised and lowered features in the polysilicon storage node, with the raised features capped with small diameter HSG polysilicon spots. This grated top surface topography is obtained via initially forming small diameter spots of intrinsic, hemi-spherical grained, (HSG), polysilicon, with the HSG spots discontinuous and overlying a heavily doped polysilicon layer. A silicon nitride deposition and etch back, expose the top surface of the HSG spots, surrounded by the silicon nitride layer. Subsequent oxidation, results in partial oxidation of the small diameter HSG spots, leaving the bottom portion of the HSG spots unoxidized. Removal of the silicon nitride layer, located between HSG spots, exposes an underlying polysilicon layer. The oxide capped, HSG spots are then used as a mask to partially etch the polysilicon layer, creating the lowered features of a subsequent storage node structure. Removal of the silicon oxide from the unoxidized bottom portion of the HSG spots, result in a HSG capped, raised feature, for the subsequent storage node structure, resulting in a greater surface area increase via use of the HSG spots as part of the storage node structure.

SUMMARY OF THE INVENTION

It is an object of this invention to create a DRAM device, with an STC structure, in which the surface area of the storage node electrode, of the STC structure is increased, without increasing the width of the STC structure.

It is another object of this invention to increase the surface area of a polysilicon storage node electrode, of the STC structure, by creating a grated topography in the top surface of a polysilicon storage node electrode.

It is yet another object of this invention to create a grated topography, for the top surface of the polysilicon storage node electrode, by using a composite spot structure, comprised of a silicon oxide capping layer on unoxidized, small diameter, HSG polysilicon spots, as a mask to define a grated structure in an underlying polysilicon layer, creating a polysilicon node electrode with protruding, HSG capped, polysilicon features.

In accordance with the present invention a method for fabricating increased capacitance DRAM devices, via use of an STC structure, comprised of a polysilicon storage node electrode with increased surface area, has been developed. Transfer gate transistors comprised of: a thin gate insulator; a polysilicon gate structure, formed from a first polysilicon layer; lightly doped source and drain regions; insulator spacers on the sidewalls of the polysilicon gate structure; and heavily doped source and drain regions; are formed on a semiconductor substrate. A composite insulator layer, comprised of a thin underlying silicon oxide layer, and a thick, overlying, doped oxide layer, is deposited, planarized, then followed by a contact hole opening in the composite insulator layer, made to expose the source and drain regions of adjacent transfer gate transistors. A second polysilicon layer is deposited, heavily doped via use of in situ doping procedures, completely filling the contact hole opening, and contacting the source and drain regions of the transfer gate transistor. The second polysilicon layer also overlies the composite insulator layer, in regions outside the contact hole opening. Thin, small diameter spots of intrinsic HSG polysilicon are next deposited on the underlying, heavily doped, second polysilicon layer. A silicon nitride layer is deposited, completely covering the HSG polysilicon spots, followed by a partial etch back of the silicon nitride layer, to a level in which the top surface of the HSG polysilicon spots are exposed. Thermal oxidation is next performed to convert a top portion of the small diameter HSG polysilicon spots to silicon oxide, while leaving the bottom portion of the HSG polysilicon spots, unoxidized. Silicon nitride, residing between the silicon oxide capped, HSG polysilicon spots, is next removed, followed by an anisotropic, RIE procedure, using the silicon oxide capped, HSG polysilicon spots, as a mask, creating moats in the second polysilicon layer, resulting in the grated topography for the top surface of the storage node structure. After removal of the silicon oxide caps, on the raised HSG capped, polysilicon features, photolithographic and dry etching procedures, are used to define the bottom electrode, or polysilicon storage node electrode shape, in the second polysilicon layer. A capacitor dielectric layer is next formed on the polysilicon storage node electrode structure, followed by the creation of an upper polysilicon electrode, or plate electrode structure, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a polysilicon storage node electrode, with increased surface area resulting from a grated top surface topography, will now be described. The transfer gate transistor, used for this DRAM device,in this invention, will be an N channel device. However the STC structure, with the increased surface area described in this invention, can also be applied to P channel, transfer gate transistor.

Figure 1:
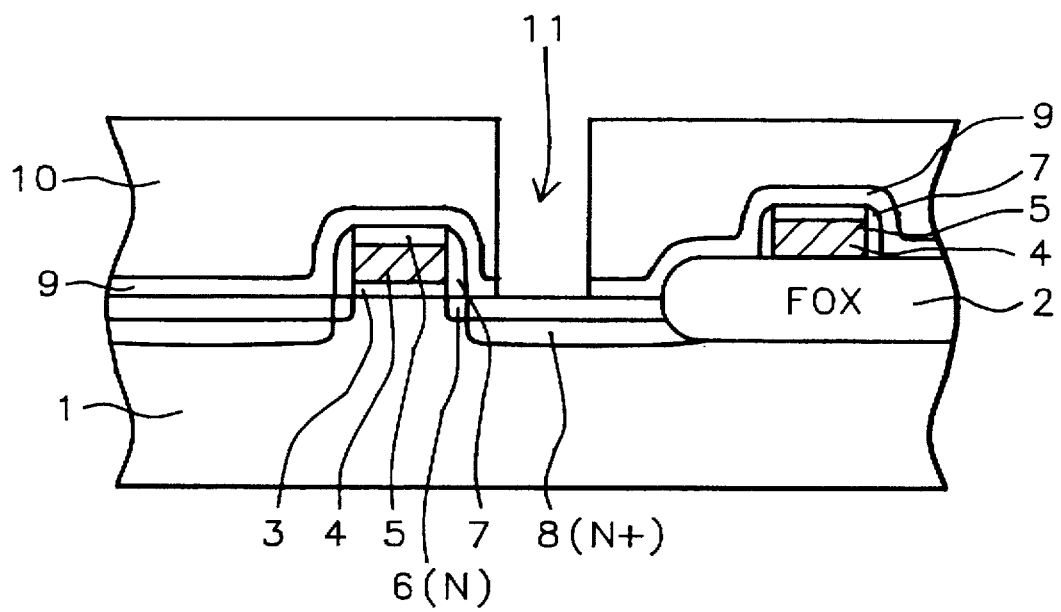
FIGS. 1–8, which schematically shows, in cross-sectional style, the key fabrication stages used in the creation of a DRAM device, with a STC structure, with an increased surface area, resulting from a polysilicon storage node electrode structure, featuring a grated top surface topography.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer, 4, is next deposited using low pressure chemical vapor deposition, (LPCVD), procedures, at a temperature between about 500° to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A first silicon oxide layer, 5, used as a cap insulator layer, is next grown via the use of either LPCVD or plasma enhanced chemical vapor deposition, (PECVD), procedures, to a thickness between about 600 to 1500 Angstroms. Conventional photolithographic and reactive ion etching, (RIE), procedures, using CHF$_3$ as an etchant for silicon oxide layer, 5, and using Cl$_2$ as an etchant for polysilicon layer, 4, are used to create polysilicon gate structures, 4, with overlying cap insulator layer, 5, shown schematically in FIG. 1. Photoresist removal is accomplished via plasma oxygen ashing and careful wet cleans.

A lightly doped source and drain region, 6, is next formed via ion implantation of phosphorous, at an energy between about 20 to 50 KeV, at a dose between about 1E13 to 1E14 atoms/cm$^2$. A second insulator layer of silicon oxide is then deposited using either LPCVD or PECVD procedures, at a temperature between about 400° to 700° C., to a thickness between about 1500 to 4000 Angstroms, followed by an anisotropic RIE procedure, using CHF$_3$ as an etchant, creating insulator spacer, 7, on the sidewalls of polysilicon gate structures, 4. A heavily doped source and drain region, 8, is then formed via ion implantation of arsenic, at an energy between about 30 to 100 KeV, at a dose between about 1E14 to 5E16 atoms/cm$^2$. The result of these procedures are schematically shown in FIG. 1.

A third insulator layer of undoped silicon oxide, 9, is next deposited using LPCVD or PECVD procedures, at a temperature between about 700° to 800° C., to a thickness between about 1000 to 1500 Angstroms. A layer of doped silicon oxide, 10, either boro-phosphosilicate glass, (BPSG), or phosphosilicate glass, (PSG), is next deposited, using PECVD procedures, at a temperature between about 700° to 800° C., to a thickness between about 3000 to 6000 Angstroms, using tetraethylorthosilicate, (TEOS) as a source with the addition of either diborane and phosphine, for the BPSG layer, or the addition of only phosphine, for the PSG layer. (Another iteration is the use of a single doped oxide or a single undoped oxide layer, replacing dual layered composite). Doped oxide layer, 10, is planarized using chemical mechanical polishing, to provide a smoother surface for subsequent depositions and patterning procedures. The result of these depositions and planarization procedures are schematically shown in FIG. 1. Conventional photolithographic and RIE procedures, using CHF$_3$ as an etchant, are used to open contact hole, 11, in doped silicon oxide layer 10, and in silicon oxide layer, 9, exposing the top surface of heavily doped source and drain region, 8, again shown schematically in FIG. 1. Photoresist removal is performed via use of plasma oxygen ashing and careful wet cleans.

Figure 2:
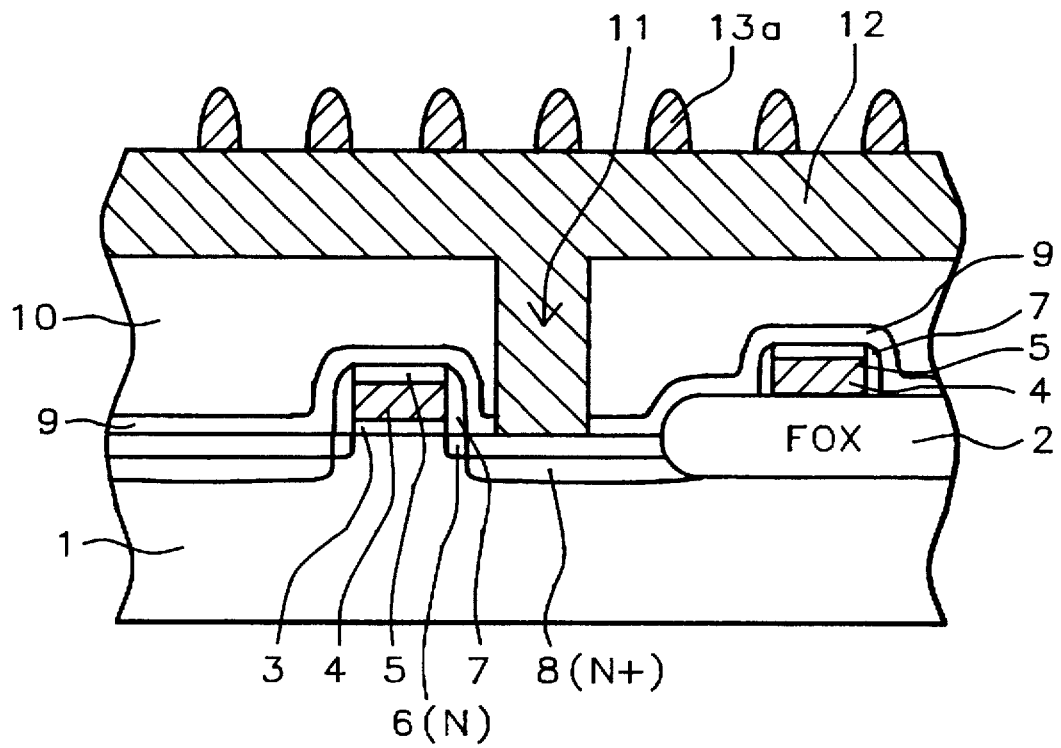

A second layer of polysilicon layer, 12, is next deposited, via LPCVD procedures, at a temperature between about 500° to 700° C., to a thickness between about 1000 to 4000 Angstroms. Polysilicon layer, 12a, can be deposited intrinsically and doped via ion implantation of either phosphorous or arsenic, or polysilicon layer, 12a, can be deposited using in situ doping procedures, via the addition of either phosphine or arsine, to a silane ambient. For both doping procedures polysilicon layer, 12a, has an N type doping concentration of between 1E20 to 1E21 atoms/cm³. Polysilicon layer, 12, shown schematically in FIG. 2, completely fills contact hole, 11, contacting underlying heavily doped source and drain regions, 8, of the underlying transfer gate transistor. A critical deposition of intrinsic, hemi-spherical grained, (HSG), polysilicon, 13a, is next deposited at a temperature between about 500° to 700° C., to a thickness in which the intrinsic HSG polysilicon is discontinuous, resulting in HSG polysilicon spots, 13a, between about 100 to 1000 Angstroms in thickness, with a diameter between about 50 to 500 Angstroms, and with a space between HSG polysilicon spots, 13a, between about 100 to 1000 Angstroms. This is schematically shown in FIG. 2.

Figure 3:
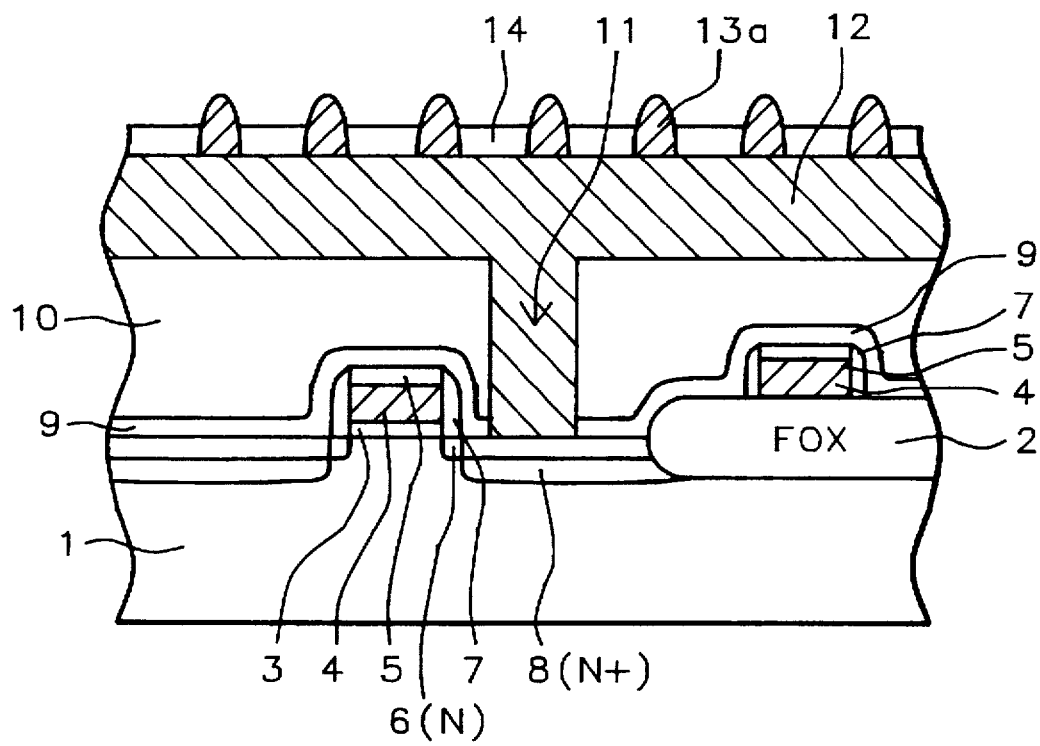

A layer of silicon nitride, 14, is next deposited using LPCVD or PECVD procedures, at a temperature between about 550° to 750° C., to a thickness between about 1000 to 2000 Angstroms. The thickness of silicon nitride layer, 14, was chosen to completely cover HSG polysilicon spots, 13a. A critical etch back, or chemical mechanical polishing step, is next employed to remove the top portion of silicon nitride layer, 14, exposing a top portion of HSG polysilicon spots, 13a. The embodiment featuring silicon nitride etch back, is performed using dry etching procedures, using $CF_4$ as an etchant. The use of $CF_4$ as the etchant allows the removal of silicon nitride to occur at a greater rate then the removal of HSG polysilicon. Therefore during the etch back procedure, at the appearance of HSG polysilicon spots, the etch back procedure is continued to allow a thickness of embedded HSG polysilicon spots to be exposed above the top surface of the recessed silicon nitride layer. This is schematically shown in FIG. 3. A second embodiment, using chemical mechanical polishing procedures, using a selectivity favoring faster removal of silicon nitride, compared to HSG polysilicon spots, results in the same structure schematically shown in FIG. 3. HSG polysilicon spots, 13a, embedded in silicon nitride layer, 14.

Figure 4:
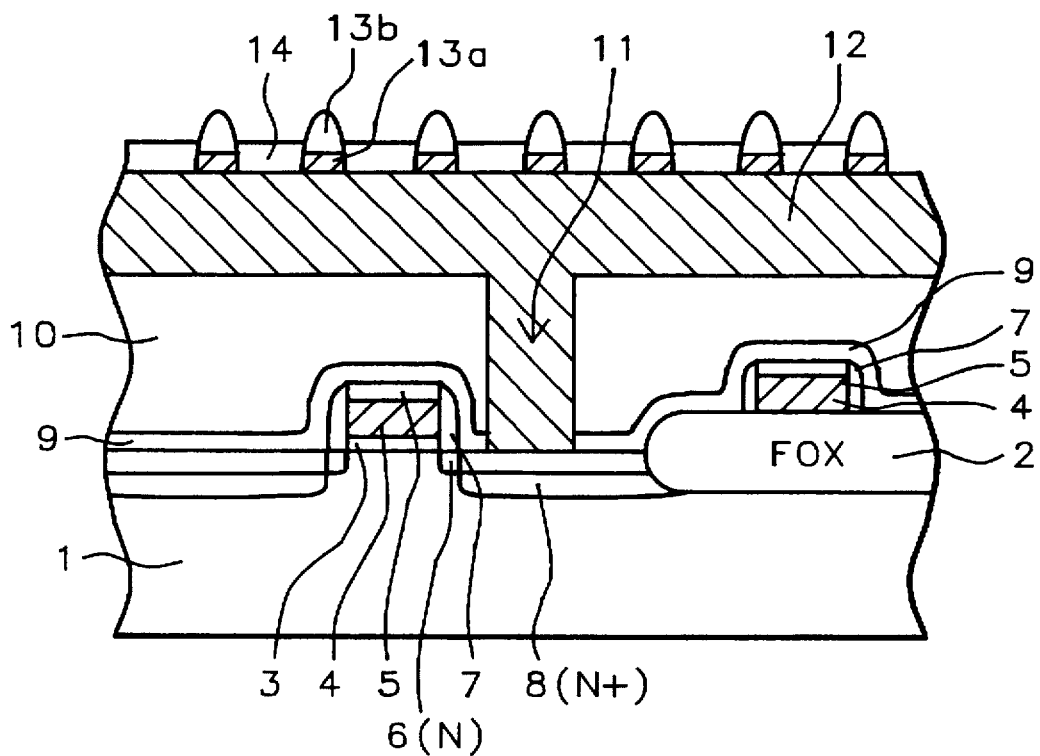

A thermal oxidation is next performed, in an oxygen-steam ambient, at a temperature between about 700° to 900° C., for a amount of time needed to either partially, or totally convert HSG polysilicon spots, 13a, to a silicon oxide capping layer, 13b. HSG polysilicon spots, 13a, are now underlying silicon oxide capping layer, 13b. This is shown schematically in FIG. 4. Polysilicon layer, 12, protected by silicon nitride layer, 14, remains unoxidized.

Figure 5:
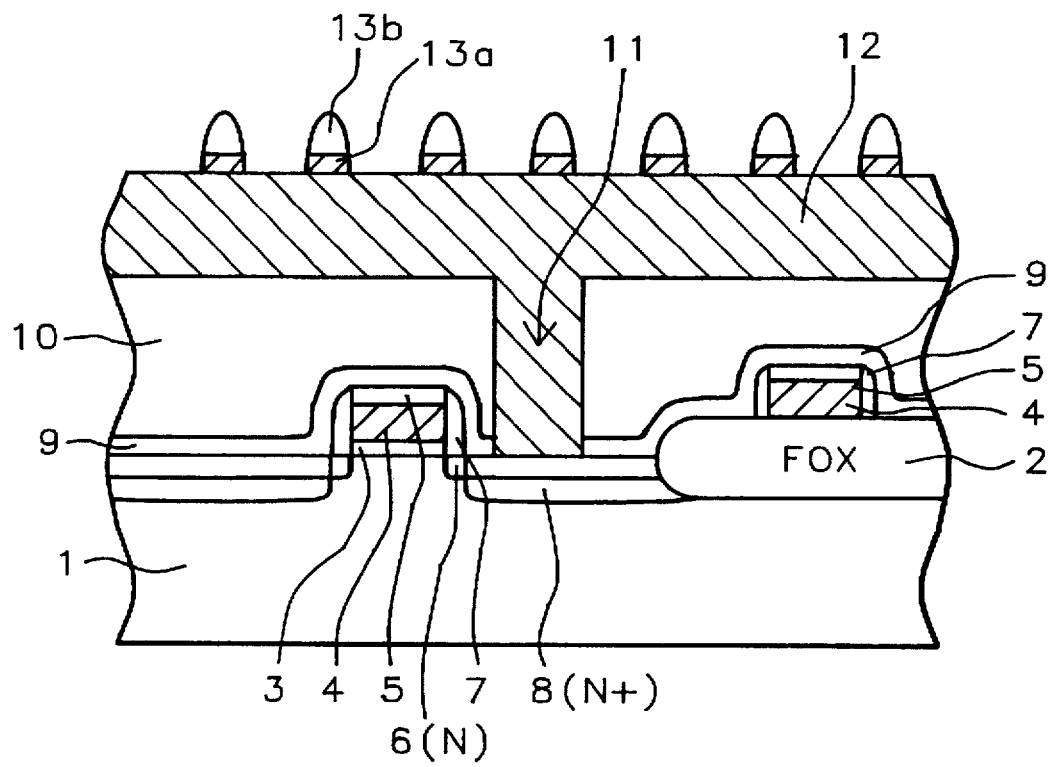

FIG. 5, schematically shows the result of removing silicon nitride layer, 14, from the ongoing structure. This is accomplished via use of a hot phosphoric acid solution, at a temperature between about 75° to 200° C. The selectivity of the hot phosphoric acid allows removal of silicon nitride layer, 14, without attack of the exposed silicon oxide capped layer, 13b, of the exposed HSG polysilicon spots, 13a, or the exposed polysilicon layer, 12. The removal of silicon nitride layer, 14, can also be accomplished using dry etching procedures, featuring etch selectivities that would result in the structure shown schematically in FIG. 5.

Figure 6:
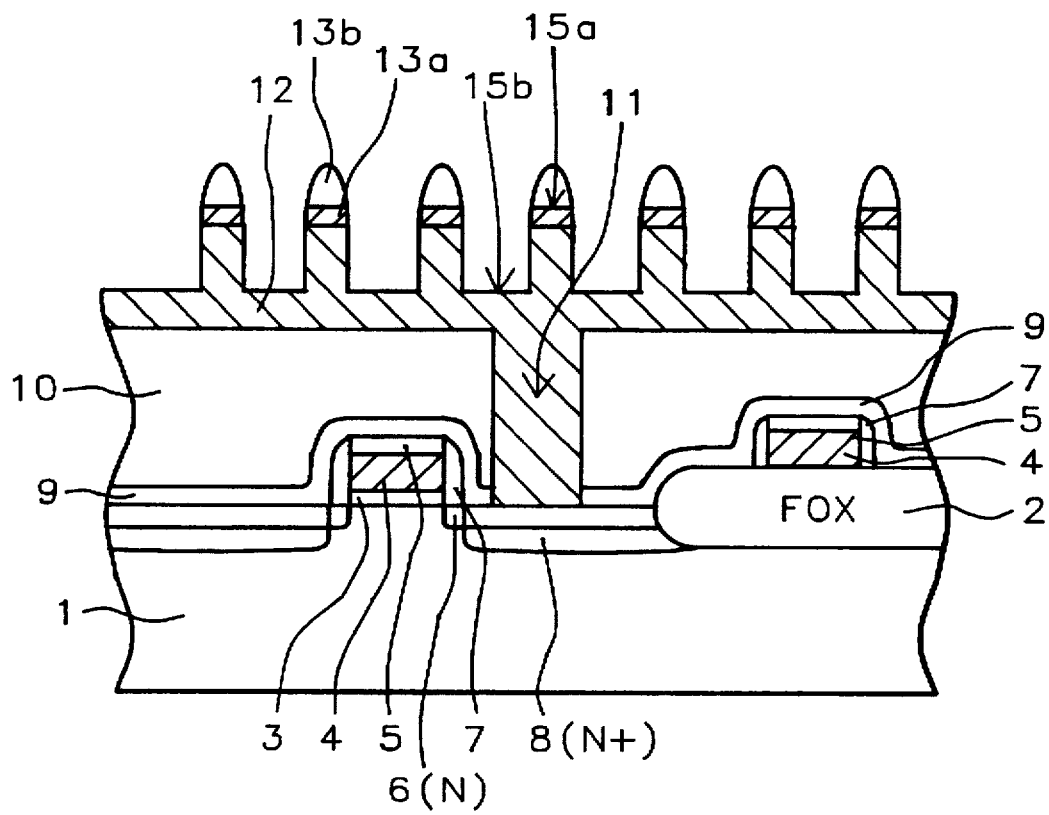

The creation of the grated topography for the top surface of polysilicon layer, 12, is next addressed. An anisotropic RIE procedure, using $Cl_2$ as an etchant is used to remove a portion of polysilicon layer, 12, in regions in which polysilicon layer, 12, is not masked by the silicon oxide capping layer, 13b, overlying HSG polysilicon spots, 13a. The procedure removes between about 500 to 3000 Angstroms of polysilicon layer, 12. This results in the desired grated topography, with a difference in height between the raised feature, 15a, of the structure, comprised of HSG polysilicon spots, 13a, overlying unetched polysilicon layer, 12, and the lower feature, 15b, of the structure, comprised of the thinned polysilicon layer, 12. This is schematically shown in FIG. 6. The slow etch rate of the masking silicon oxide capping layer, 13b, in the $Cl_2$ etch ambient, allowed definition of the features to be accomplished.

Figure 7:
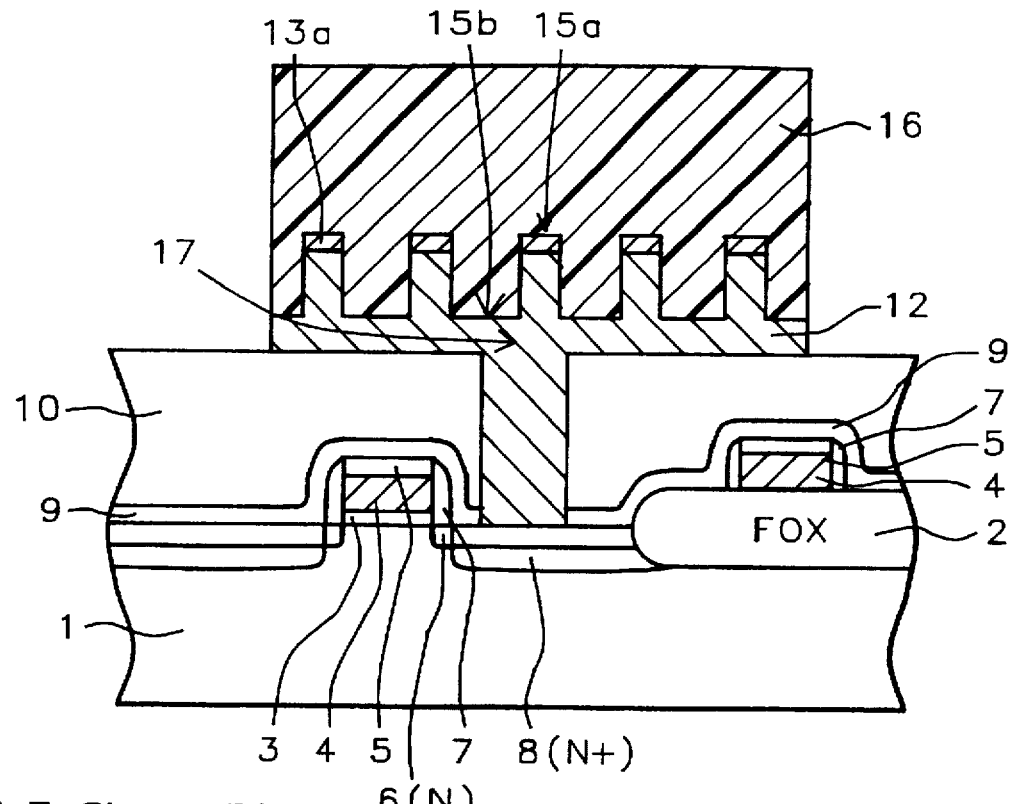

Removal of silicon oxide capping layer, 13b, is next accomplished via a buffered hydrofluoric acid solution. A photoresist shape, 16, is then used as a mask to allow patterning, to create polysilicon storage node electrode, 17, to occur. An anisotropic RIE procedure, again using $Cl_2$ as an etchant, is used to remove unwanted raised features, comprised of HSG polysilicon spots, on polysilicon layer, 12, as well removal of the lower feature, comprised of thinned polysilicon layer, 12. Again the selectivity of the etch procedure, using $Cl_2$ as an etchant, allows thicker polysilicon layers to be removed without attacking the exposed doped silicon oxide layer, 10. This is schematically shown in FIG. 7. Removal of photoresist shape, 16, is performed using plasma oxygen ashing and careful wet cleans.

Figure 8:
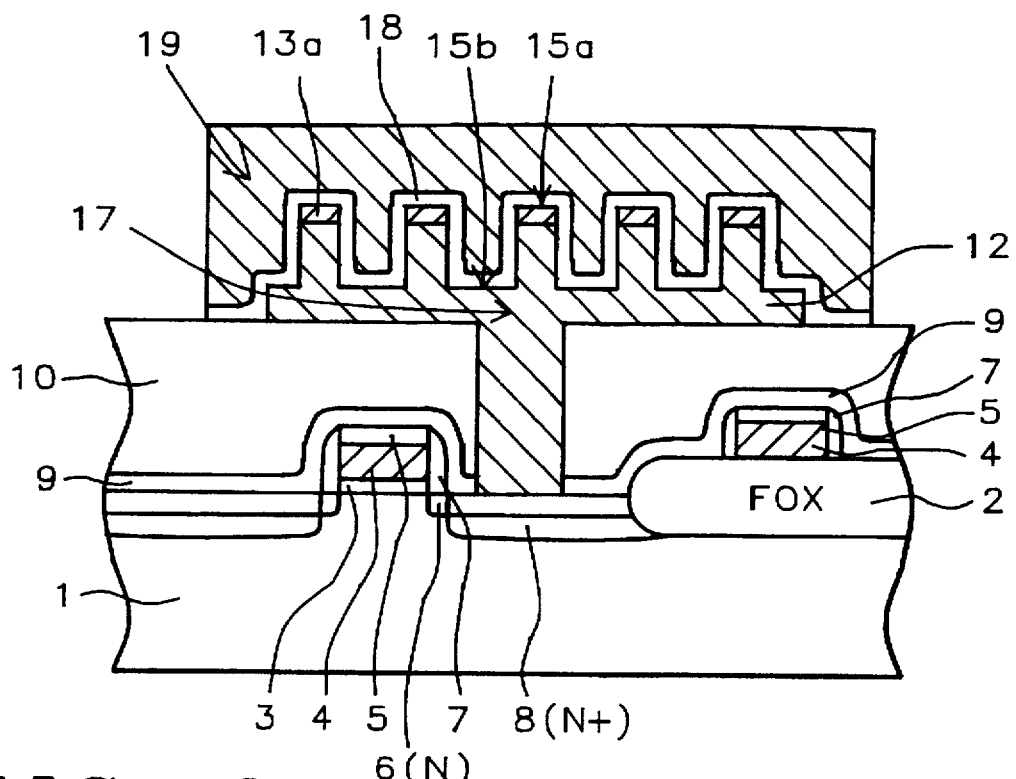

FIG. 8, schematically shows the completion of the STC structure. First a dielectric layer, 18, is formed, overlying the polysilicon storage node electrode, 17. Dielectric layer, 18, can be an insulator layer possessing a high dielectric constant, such as $Ta_2O_1$, obtained via r.f sputtering techniques, at a thickness between about 10 to 100 Angstroms. Dielectric layer, 18, can also be ONO, (Oxidized - silicon Nitride - silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 2000 Angstroms. Doping of this polysilicon layer is accomplished via an situ doping deposition procedure, by the addition of phosphine, to the silane ambient. Photolithographic and RIE procedures, using $Cl_2$ as an etchant, are next employed to create polysilicon upper electrode, or plate electrode, 19, shown schematically in FIG. 8. Photoresist is again removed via plasma oxygen ashing and careful wet cleans, resulting in STC structure featuring increased surface area of polysilicon storage node electrode, 17.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a DRAM device, on a semiconductor substrate, comprised of an underlying transistor; with a gate insulator, a gate electrode structure, formed from a first insulator layer, and from a first polysilicon layer, insulator sidewall spacers, formed from a second insulator layer, and source and drain regions, and an overlying STC structure; with a polysilicon storage node electrode, a dielectric layer, and an overlying polysilicon plate electrode, and with the top surface of said polysilicon storage node electrode, exhibiting a grated, top surface topography, comprising the steps of:

depositing a third insulator layer, on said underlying transistor of said DRAM device;

depositing a doped dielectric layer on said third insulator layer;

planarizing said doped dielectric layer;

opening a contact hole, in said doped dielectric layer, and in said third insulator layer, to expose top surface of said source and drain regions, of said underlying transistor;

depositing a second polysilicon layer on top surface of said doped dielectric layer, and on top surface of said source and drain regions, exposed in said contact hole;

depositing HSG polysilicon spots on said second polysilicon layer;

depositing a silicon nitride layer, on said HSG polysilicon spots, completely covering said HSG polysilicon spots, and depositing silicon nitride layer on said second polysilicon layer, exposed between said HSG polysilicon spots;

removing top portion of said silicon nitride layer, exposing a top portion of HSG polysilicon spots, while still leaving bottom portion of said silicon nitride layer, on said second polysilicon layer, in regions not covered by said HSG polysilicon spots;

oxidizing exposed top portion of said HSG polysilicon spots, creating a composite spot structure of a silicon oxide capping layer, overlying an unoxidized, bottom portion of said HSG polysilicon spot;

removing bottom portion of said silicon nitride layer, exposing said second polysilicon layer, in regions not covered by said composite spot structure;

anisotropic dry etching to remove a top portion of said second polysilicon layer in regions where said second polysilicon layer is not covered by said composite spot structure, resulting in a grated, top surface topography, for said second polysilicon layer, comprised of lowered features of bottom portions of said second polysilicon layer, and raised features, comprised of the unoxidized, bottom portions of said HSG polysilicon spots, on unetched, said second polysilicon layer;

removing said silicon oxide capping layer from said composite spot structure;

patterning of said second polysilicon layer, to create said polysilicon storage node electrode, with said grated top surface topography;

forming said dielectric layer on said polysilicon storage node electrode;

depositing a third polysilicon layer on said dielectric layer; and patterning of said third polysilicon layer to form said plate electrode, of said STC structure.

2. The method of claim 1, wherein said second polysilicon layer is deposited using LPCVD procedures, at a temperature between about 500° to 700° C., to a thickness between about 1000 to 4000 Angstroms, with a N type dopant concentration between about 1E20 to 1E21 atoms/cm$^3$, obtained using in situ doping procedures, via the addition of phosphine or arsine to a silane ambient.

3. The method of claim 1, wherein said HSG polysilicon spots are deposited, intrinsically, at a temperature between about 500° to 700° C., to a thickness between about 100 to 1000 Angstroms, with a diameter between about 50 to 500 Angstroms.

4. The method of claim 1, wherein the space between said HSG polysilicon spots is between about 100 to 1000 Angstroms.

5. The method of claim 1, wherein said silicon nitride layer is deposited using LPCVD or PECVD procedures, at a temperature between about 500° to 750° C., to a thickness between about 1000 to 2000 Angstroms.

6. The method of claim 1, wherein said silicon nitride is etched back via dry etching procedures, using $CF_4$ as an etchant.

7. The method of claim 1, wherein said silicon oxide capping layer is grown via thermal oxidation of a either the top portion of said HSG polysilicon spots, or the entire thickness of HSG polysilicon spots, in an oxygen—steam ambient, at a temperature between about 700° to 900° C.

8. The method of claim 1, wherein anisotropic dry etching procedure, is performed using $Cl_2$ as an etchant, creating a grated top surface topography for said second polysilicon layer, comprised of raised features, comprised of unoxidized, bottom portions of said HSG polysilicon spots, on said second polysilicon layer, and lowered features, comprised of bottom portions of said second polysilicon layer.

9. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

10. The method of claim 1, wherein said third polysilicon layer, used for creation of said polysilicon plate electrode of said STC structure, is deposited using LPCVD procedures, at a temperature between about 500° to 700° C., to a thickness between about 1000 to 2000 Angstroms.

11. A method of fabricating a stacked capacitor structure, (STC), for a DRAM device, in which the surface area of the polysilicon storage node electrode is increased via use of a polysilicon storage node electrode, exhibiting a grated top surface topography, obtained anisotropic dry etching of a polysilicon layer, using a etch mask obtained from partial oxidation of small diameter, HSG polysilicon spots, comprising the steps of:

depositing a first insulator layer on an underlying transistor structure, of said DRAM device;

depositing a doped dielectric layer on said first insulator layer;

planarizing said doped dielectric layer;

opening a contact hole in said doped dielectric layer, and in said first insulator layer, to expose top surface of said underlying transistor region;

depositing a first polysilicon layer on top surface of said doped dielectric layer, and on said top surface of said underlying transistor region, exposed in said contact hole;

depositing small diameter, HSG polysilicon spots on said first polysilicon layer;

depositing a silicon nitride layer on said small diameter, HSG polysilicon spots, completely covering said small diameter, HSG polysilicon spots, as well as depositing silicon nitride on said first polysilicon layer, exposed between said small diameter, HSG polysilicon spots;

removing a top portion of said silicon nitride layer, exposing a top portion of said small diameter, HSG polysilicon spots, while still leaving a bottom portion of said silicon nitride layer, on said first polysilicon layer, in regions in which said first polysilicon layer is not covered by said small diameter, HSG polysilicon spots;

oxidizing exposed top portion of said small diameter, HSG polysilicon spots, creating a small diameter, composite spot structure, of a silicon oxide capping layer, on an unoxidized, bottom portion of said small diameter, HSG polysilicon spots;

removing bottom portion of said silicon nitride layer, exposing said first polysilicon layer, in regions not covered by said small diameter, composite spot structure;

anisotropic dry etching to remove a top portion of said first polysilicon layer, in regions not covered by said small diameter, composite spot structure, resulting in a grated top surface topography for said first polysilicon layer, comprised of raised features of unoxidized, bottom portions of said small diameter, HSG polysilicon spots, overlying unetched regions of said first polysilicon layer, and comprised of lowered features, exhibiting a bottom portion of said first polysilicon layer;

removing said silicon oxide capping layer from said composite spot structure;

patterning of said first polysilicon layer to create said polysilicon storage node electrode, with said grated top surface topography;

forming a dielectric layer on said polysilicon storage node electrode;

depositing a second polysilicon layer on said dielectric layer; and patterning of said second polysilicon layer to form polysilicon plate electrode, of said STC structure.

12. The method of claim 11, wherein said first polysilicon layer is obtained via LPCVD procedures, at a temperature between about 500° to 700° C., to a thickness between about 1000 to 4000 Angstroms, with an N type dopant concentration between about 1E20 to 1E21 atoms/cm$^3$, obtained using an in situ doping procedure via the addition of either phosphine or arsine to a silane ambient.

13. The method of claim 11, wherein said small diameter, HSG polysilicon spots are deposited at a temperature between about 500° to 700° C., to a thickness between about 100 to 1000 Angstroms, with a diameter between about 50 to 500 Angstroms.

14. The method of claim 11, wherein the space between said small diameter, HSG polysilicon spots is between about 100 to 1000 Angstroms.

15. The method of claim 11, wherein said silicon nitride layer is deposited using LPCVD or PECVD procedures, at a temperature between about 500° to 750° C., to a thickness between about 1000 to 2000 Angstroms.

16. The method of claim 11, wherein said silicon nitride layer is etched back via anisotropic dry etching procedures, using $CF_4$ as an etchant.

17. The method of claim 11, wherein said silicon oxide capping layer is grown via thermal oxidation of either a top portion of said small diameter, HSG polysilicon spots, or the entire thickness of small diameter, HSG polysilicon spots, in an oxygen—steam ambient, at a temperature between about 700° to 900° C.

18. The method of claim 11, wherein said grated top surface topography of said first polysilicon layer is created via anisotropic dry etching procedures, using $Cl_2$ as an etchant, comprised of raised features of unoxidized, bottom portions of said small diameter, HSG polysilicon spots, on unetched regions of said first polysilicon layer, and lowered features comprised of bottom portions of said first polysilicon layer.

19. The method of claim 11, wherein said dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

20. The method of claim 11, wherein said second polysilicon layer is deposited using LPCVD procedures, at a temperature between about 500° to 700° C., to a thickness between about 1000 to 2000 Angstroms.

21. The method of claim 11, wherein said polysilicon plate electrode is created via RIE of said second polysilicon layer, using $Cl_2$ as an etchant.

* * * * *